(12) United States Patent
Overgaard

(10) Patent No.: US 6,331,927 B1
(45) Date of Patent: Dec. 18, 2001

(54) PORTABLE RETRACTABLE STATIC ELECTRICITY SHIELD

(75) Inventor: Mark F. Overgaard, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/299,620

(22) Filed: Apr. 27, 1999

(51) Int. Cl.[7] ....................................................... H02H 1/00
(52) U.S. Cl. ............................................. 361/212; 361/220
(58) Field of Search .................................... 361/212, 220, 361/115, 42

(56) References Cited

U.S. PATENT DOCUMENTS

| | | | |
|---|---|---|---|
| 4,427,114 | 1/1984 | Howell et al. ........................ | 206/328 |
| 5,014,849 | * 5/1991 | Becker ................................. | 206/328 |
| 5,315,255 | 5/1994 | Bettinger ............................. | 324/457 |
| 5,383,097 | 1/1995 | Delucia et al. ...................... | 361/816 |
| 5,410,372 | * 4/1995 | Lee ...................................... | 348/818 |
| 5,448,405 | * 9/1995 | Clausen et al. ..................... | 359/601 |
| 5,791,485 | * 8/1998 | Carbonneau ........................ | 206/720 |
| 6,058,000 | * 5/2000 | Koenck et al. ..................... | 361/113 |

* cited by examiner

Primary Examiner—Stephen W. Jackson
(74) Attorney, Agent, or Firm—Perkins Coie LLP

(57) ABSTRACT

A shield for protecting electrostatic discharge sensitive components from static electricity. The shield includes a screen formed of a static electricity dissipative material. A housing is provided from which and to which the screen can be extended and retracted. A motor may be incorporated in the shield to extend and retract the screen. Eyebolts are included for hanging and anchoring the shield. In an alternative embodiment, the shield is hung on a stand having a bracket with a hook.

60 Claims, 3 Drawing Sheets

PORTABLE RETRACTABLE STATIC ELECTRICITY SHIELD

FIELD OF THE INVENTION

The present invention relates to a method and apparatus for shielding static electricity sensitive components. More particularly, the present invention relates to the use of a screen formed of static electricity dissipative material for shielding components.

BACKGROUND OF THE INVENTION

Assembly of certain components which are sensitive to static electricity often takes place on microelectronics production floors. It is, therefore, necessary to provide a barrier between such components and any generators of static electricity which may be found on the production floor. The most common generators of static electricity are insulators. Insulators, which have a resistance factor of $10^{11}$ (ohms) $\Omega$ or more, when rubbed together will hold a static charge. Examples of insulators include clothing, hair, certain plastic products, Styrofoam, paper, non-treated Lexan (acrylic), certain computer monitors, non-safe plastic wrap, and non-safe rubber items.

Conventional procedure is to assemble such static electricity sensitive components in a segregated electrostatic discharge ("ESD") safe area. This is generally accomplished by erecting a barrier around the ESD safe area, providing a thirty-six inch buffer zone between the ESD safe area and the remainder of the production floor, or the non-ESD safe area.

Providing such a buffer zone is an inefficient use of the available production floor. Thus, there exists a need for a barrier which makes a more efficient use of the production floor while still protecting ESD sensitive components.

SUMMARY OF THE INVENTION

The present invention provides a ground shield having a screen formed of a static electricity dissipative material, at least one fastening structure for anchoring the screen, and a structure for extending and retracting the screen. In an aspect of the invention, die shield is ground by the fastening structure. In another aspect of the invention, the shield is ground through connection with an overhead conductive grid.

In one embodiment of the invention, the static electricity dissipative material has a resistance factor of no greater than $10^4$ ohms.

In another embodiment of the invention, the structure for extending and retracting the screen includes a motor.

In another embodiment of the invention, the screen includes a spring loaded mechanism used to extend and retract the screen.

The present invention also provides a method of shielding ESD sensitive components including the steps of putting ESD sensitive components in a first area separated from a second area, partitioning the first area from the second area using at least one shield having a screen.

DETAILED DESCRIPTION OF PREFERRED EMBODIMENTS

Figure 1:
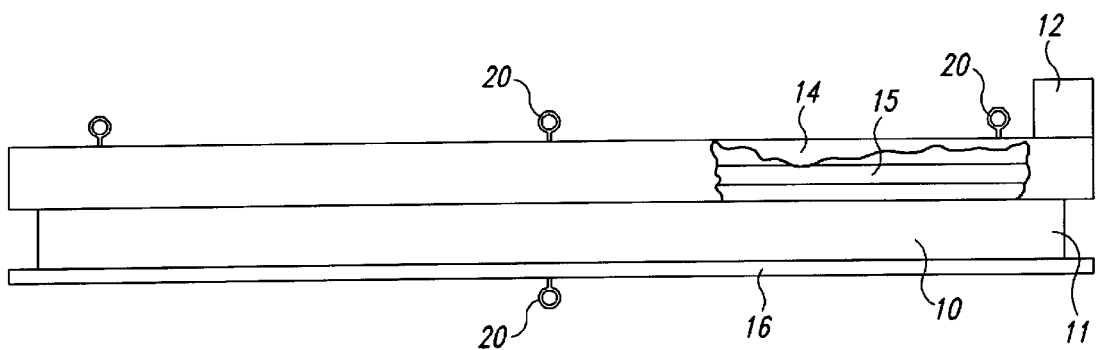
FIG. 1 is a front view of a shield constructed in accordance with a first embodiment of the present invention.

With reference to FIG. 1, there is illustrated a shield 10 constructed in accordance with a first embodiment of the present invention. The shield 10 includes a screen 11, a screen housing 14, and a weight bar 16. The screen 11 is extendable and retractable from and into the screen housing 14.

In the embodiment illustrated in FIG. 1, a motor 12 is shown. The motor 12 is linked to the shield 10 through an electrically conductive roller 15. The motor rotates the roller 15 selectively in opposite directions, allowing the screen 11 to wind around the roller 15 and extend into and retract from the screen housing 14. The weight bar 16 is positioned at a lower extent of the screen 11 and causes the screen 11 to hang straight.

The screen 11 is formed of a light weight static electricity dissipative material. The material may be opaque, translucent or transparent. Further, the material may form the screen in a variety of ways, such as, for example, being woven or being extruded. In one embodiment, the material has a resistance factor of $10^4$ ohms ($\Omega$) or less. Although each ESD sensitive component 60 (FIG. 5) may be different in its resistance to damage from electrostatic discharge, a screen formed of a static electricity dissipative material with a resistance factor of $10^4\Omega$ or less will provide the greatest protection to the widest range of components.

Suitable materials with resistance factors of $10^4\Omega$ or less include a metallic material, carbon material, a fabric material having entwined metal or carbon, carbon-based cloth, or metal screen cloth. Alternatively, the screen 11 may be formed of any light weight material which is coated with a static dissipative coating, such as a heavy staticide.

Figure 2:
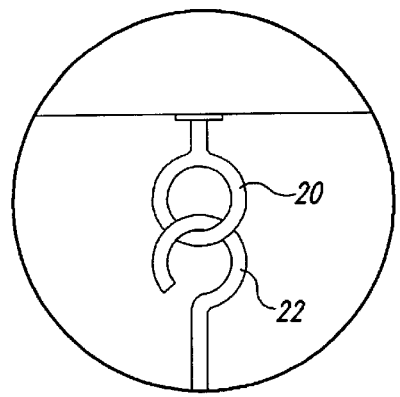
FIG. 2 illustrates an eyebolt-hook arrangement used with the shield of FIG. 1.

As illustrated in FIG. 1, a plurality of eyebolts 20 are provided along a top portion of the screen housing 14. The eyebolts 20 may be connected to a permanent structure, such as a ceiling, in order to allow the screen 11 to be extended downwardly towards the floor. Another eyebolt 20 is affixed to a lower portion of the weight bar 16 and functions to lock the screen 11 in its extended position by connecting to a fastener in the floor. The eyebolts 20 may connect with a variety of fasteners, such as, for example, hooks 22 (FIG. 2). Alternatively, only one eyebolt 20 may be positioned on the housing 14 and a plurality of eyebolts 20 may be positioned on the weight bar 16.

Figure 5:
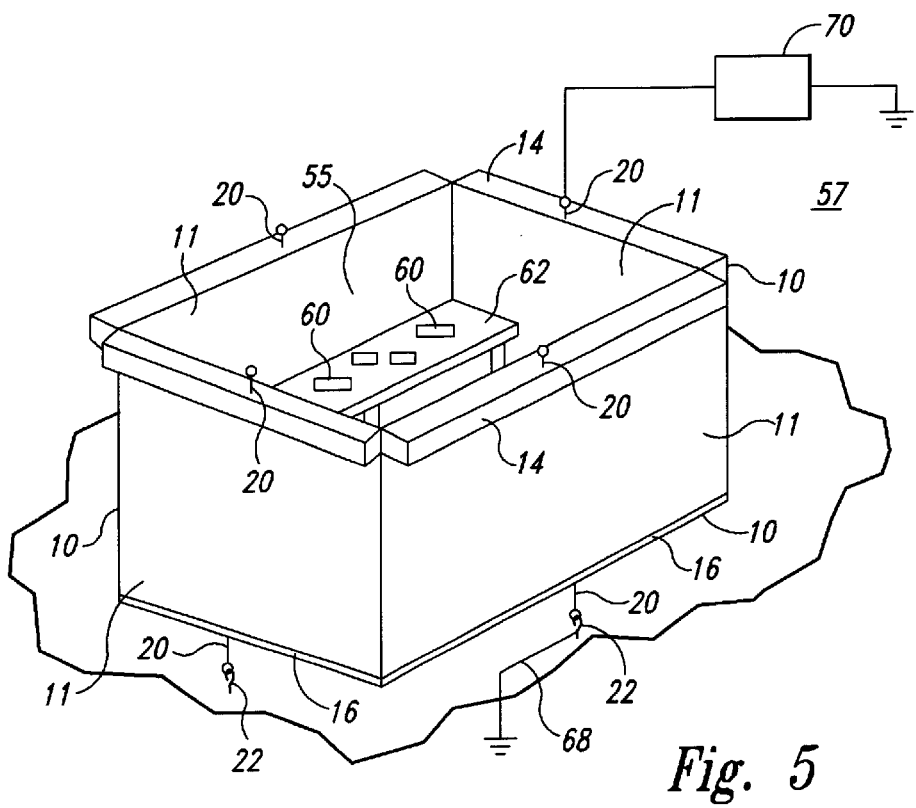
FIG. 5 is a view of the shields of FIG. 1 in use.

To function as a proper electrostatic shield, the shield 10 must be positioned so as to block the majority of the static electricity which may be generated. It is envisioned that the screen 11 should be placed such that it extends vertically from the floor to a height greater than the height at which the electrostatic discharge ("ESD") sensitive components 60 are positioned. As shown in FIG. 5, the ESD sensitive components 60 are positioned upon a table 62 within an area 55 segregated from a second area 57. The area 55 is the ESD safe area, while the area 57 is the non-ESD safe area. For clarity of illustration, the hooks 22 are not shown in FIG. 5 in connection with the eyebolts 20 on the housings 14. Also for the sake of clarity, only one eyebolt 20 is shown in FIG. 5 for each housing 14.

In addition to the static dissipative nature of the screen 11, the shield 10 is grounded, thereby decreasing the likelihood of a build up of static electricity on the screen 11. As shown in FIG. 5, the hooks 22 may be connected to a ground 68. The ground 68 may be a ground conductor at a wall outlet or an overhead ground connector. Alternatively, the hooks 22 may themselves act as a ground. Alternatively, the shield 10 may be ground through connection to an electrically conductive grid, such as an overhead grid 70, shown schematically in FIG. 5.

Figure 6:
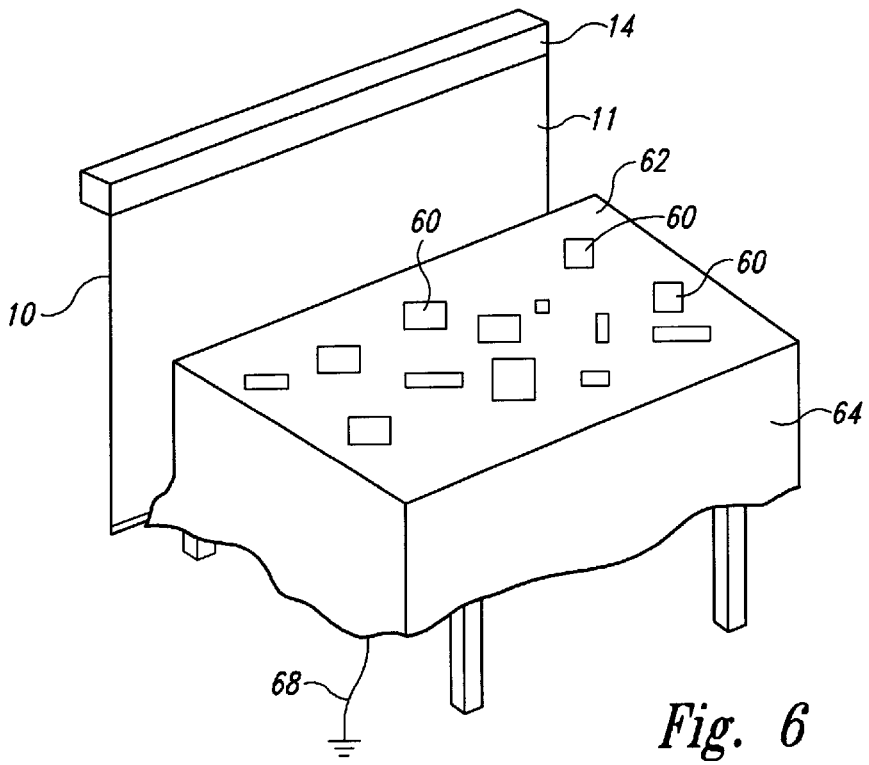
FIG. 6 is another view of the shield of FIG. 1 in use.

Referring to FIG. 6, there is shown the shield 10 positioned near the table 62 upon which are placed the ESD sensitive components 60. A sheet 64 of static dissipative material covers the table 62 and is connected to ground 68. Further, the shield 10 may be connected to the sheet 64, thus increasing the dissipation of any static electricity on the shield 10 to the ground 68. Although only one shield 10 is shown in FIG. 6, it is to be understood that multiple shields 10 may be thus connected.

Figure 4:
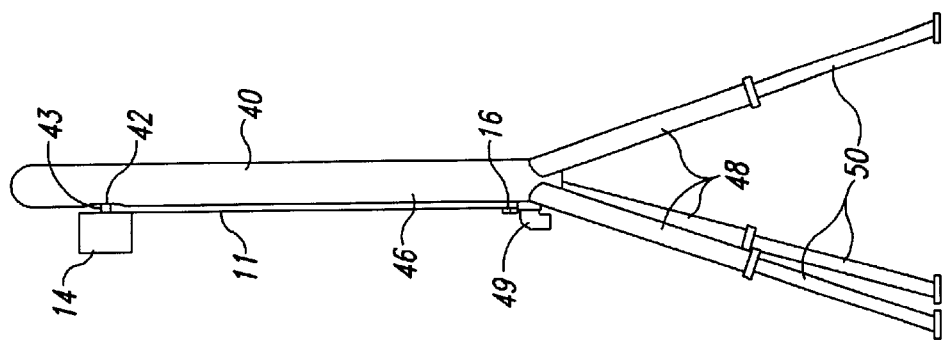
FIG. 4 is a side view of the stand and shield of FIG. 3.
Figure 3:
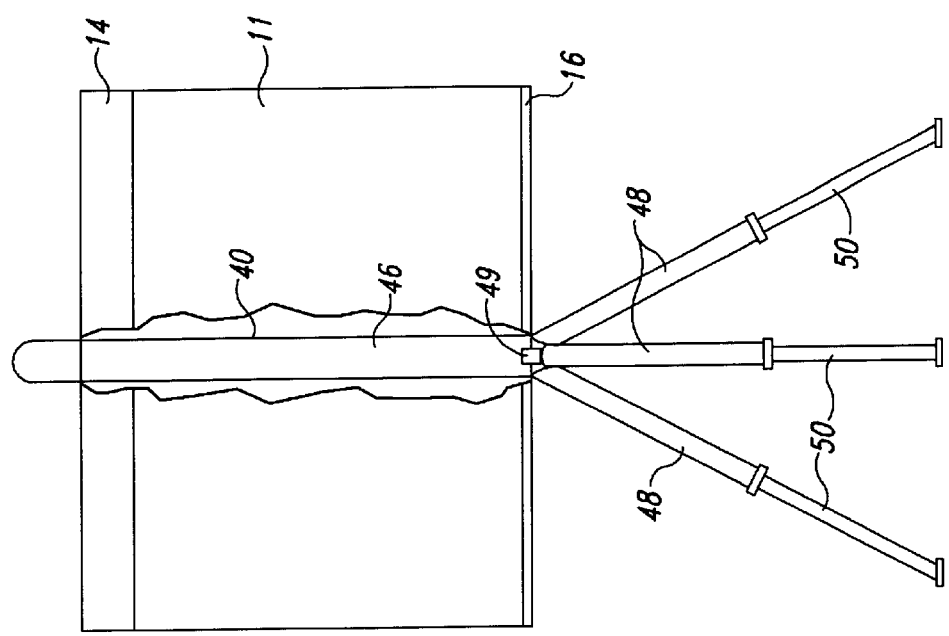
FIG. 3 is a front view of a stand and a partial view of a shield mounted thereon and constructed in accordance with a second embodiment of the present invention.

With reference to FIGS. 3–4, there is illustrated a screen stand 40 for use with a smaller version of the shield 10. Instead of hanging the shield 10 on the ceiling, or other permanent structure, the shield 10 may be pivotably hung from one or more screen stands 40. The use of the screen stand 40 enhances the portability of the shield 10.

The screen stand 40 includes a spar 46, from which a plurality of legs 48 extend. The legs 48 may include telescoping portions 50. The spar 46 includes a hook 49 near the location where the legs 48 connect to the spar 46. The stand 40 includes a pivoting mechanism 42. The mechanism 42 may consist of an opening for receiving a pivoting pin 43 mounted on the back of the housing 14. Further, the mechanism 42 may include a pair of detents (not shown) which act to stabilize the shield 10 in the horizontal and the vertical positions.

In this embodiment, the pin 43 is located generally at a midpoint on the housing 14. In practice, the pin 43 is connected with the pivoting mechanism 42. A lower eyebols 20 on the weight bar 16 is connected to the hook 49. One or more stands 40 may be used to connect with and balance the shield 10. Once the shield 10 is connected with one or more pivoting mechanisms 42 of one or more stands 40, the screen 11 may be extended downwardly. Alternatively, the shield 10 may be connected with the hook 49 and extended upwardly to connect with one or more pivoting mechanisms 42.

In this version of the invention, it may be unnecessary to include a motor 12, and instead the screen 11 may be manually extended and retracted, using an internal spring mechanism, much like a window shade in a home. Specifically, the screen 11 winds around the roller 15, which includes a retractable spring mechanism. Alternatively, the shield 10 may have a ratchet mechanism for extending and retracting the screen 11. Upon retraction, the screen 11 may be pivoted along with the pivot plate 43 and the bracket 42 such that the screen 11 aligns with the spar 46. This allows for easier transport and storage of the screen 11 and stand 40.

The screen 11 may be grounded through the stand 40. Specifically, the spar 46 and/or the legs 48 may be formed of an electrically conductive material and grounded. The screen 11 may be electrically connected to the stand through pin 43 and/or the hook 49. Alternatively, a grounding clip may electrically connect the screen 11 to the stand 40 or directly to ground.

Through the use of one or more of the shields 10, an area safe from unacceptable static discharge may be created. This can be done without the necessity for a thirty-six inch buffer zone surrounding the static free area. Thus, a more efficient use can be made of production space.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while hooks 42, 49 are shown on the stand 40, it is to be understood that any other suitable mechanism, such as a clasp, may be used for mounting the screen 11. Accordingly, the invention is not to be seen as limited by the foregoing description, but is only limited by the scope of the appended claims.

What is claimed as new and desired to be protected by Letters Patent of the United States is:

1. A static electricity shield, comprising:
   a screen including a static electricity dissipative material;
   a support structure adapted to mount said screen in a vertical direction;
   at least one fastening structure for anchoring said screen; and
   a structure for extending and retracting said screen.

2. The shield of claim 1, wherein the shield is portable and said screen is retractable.

3. The shield of claim 1, wherein said structure for extending and retracting includes a roller connected to a retractable spring mechanism, said screen being wound around said roller.

4. The shield of claim 1, wherein said structure for extending and retracting includes a roller connected to a motor for driving said roller in opposite directions to extend and retract said screen, said screen being wound around said roller.

5. The shield of claim 4, wherein said structure for extending and retracting includes a conductive roller which is driven by said motor.

6. The shield of claim 5, further comprising a housing for housing said roller and said motor.

7. A static electricity shield, comprising:
   a screen including a static electricity dissipative material;
   a support structure adapted to mount said screen in a vertical direction; and
   a weight bar attached to a bottom portion of said screen for enabling said screen to hang straight.

8. The shield of claim 1, wherein said at least one fastening structure includes an eyebolt.

9. A static electricity shield, comprising:
   a screen including a static electricity dissipative material, wherein said screen is grounded through connection with an electrical outlet; and
   a support structure adapted to mount said screen in a vertical direction.

10. A static electricity shield, comprising:
    a screen including a static electricity dissipative material, wherein said screen is grounded through connection with an overhead grid; and
    a support structure adapted to mount said screen in a vertical direction.

11. The shield of claim 1, wherein said mounting structure comprises a stand including a spar having a bracket with a hook and a plurality of legs, said screen being anchored to said stand with said fastening structure.

12. The shield of claim 11, wherein said fastening structure comprises a pivoting mechanism for enabling said shield to be pivoted into vertical alignment with said spar.

13. The shield of claim 11, wherein said legs include telescoping portions.

14. The shield of claim 11, wherein said stand has three legs.

15. A portable retractable static electricity shield, comprising:
   a screen having a resistance factor of no greater than $10^4$ ohms;
   at least one fastening structure for anchoring said screen;
   a mounting structure for mounting said screen in a vertical direction; and
   a structure for extending and retracting said screen.

16. The shield of claim 15, wherein said screen comprises a static electricity dissipative material.

17. The shield of claim 15, wherein said at least one fastening structure includes at least one eyebolt.

18. The shield of claim 15, wherein said structure for extending and retracting includes a roller connected to a retractable spring mechanism, said screen being wound around said roller.

19. The shield of claim 15, wherein said structure for extending and retracting includes a roller connected to a motor for driving said roller in opposite directions to extend and retract said screen, said screen being wound around said roller.

20. The shield of claim 19, wherein said structure for extending and retracting includes a conductive roller which is driven by said motor.

21. The shield of claim 20, further comprising a housing for housing said roller and said motor.

22. The shield of claim 15, wherein said screen is grounded.

23. The shield of claim 22, wherein said screen is grounded through connection with a ground conductor.

24. The shield of claim 22, wherein said screen is grounded through connection with an electrical outlet.

25. The shield of claim 22, wherein said screen is grounded through connection with an overhead grid.

26. The shield of claim 15, wherein said mounting structure comprises a stand including a spar having a bracket with a hook and a plurality of legs, said screen being anchored to said stand with said fastening structure.

27. The shield of claim 26, wherein said fastening structure comprises a pivoting mechanism for enabling said shield to be pivoted into vertical alignment with said spar.

28. The shield of claim 26, wherein said legs include telescoping portions.

29. The shield of claim 26, wherein said stand has three legs, two of said legs including hooks for anchoring said screen.

30. A portable and retractable system for shielding electrostatic discharge sensitive components from static electricity, comprising:
   at least one portable retractable static electricity shield, including:
      a screen formed of a static electricity dissipative material;
      a housing, said screen being extendable from and retractable into said housing; and
      a mounting structure adapted to mount said housing, said screen hanging in a vertical direction when extended from said housing.

31. The system of claim 30, wherein said at least one shield includes:
   at least one fastening structure for anchoring said screen; and
   a structure for extending and retracting said screen.

32. The system of claim 31, wherein said structure for extending and retracting includes a roller connected to a retractable spring mechanism, said screen being wound around said roller.

33. The system of claim 31, wherein said structure for extending and retracting includes a roller connected to a motor for driving said roller in opposite directions to extend and retract said screen, said screen being wound around said roller.

34. The system of claim 33, wherein said structure for extending and retracting includes a conductive roller which is driven by said motor.

35. The system of claim 30, wherein said screen is grounded.

36. The system of claim 35, wherein said screen is grounded through connection with a ground conductor.

37. The system of claim 35, wherein said screen is grounded through connection with an electrical outlet.

38. The system of claim 35, wherein said screen is grounded through connection with an overhead grid.

39. The system of claim 30, wherein said static dissipative material has a resistance factor of no greater than $10^4$ ohms.

40. The system of claim 30, further including a weight bar attached to a bottom portion of said screen for enabling said screen to hang straight.

41. The system of claim 31, wherein said at least one fastening structure includes an eyebolt.

42. The system of claim 30, wherein said mounting structure comprises a stand including a spar having a bracket with a hook and a plurality of legs, said screen being anchored to said stand with said fastening structure.

43. The system of claim 42, wherein said fastening structure comprises a pivoting mechanism for enabling said shield to be pivoted into vertical alignment with said spar.

44. The system of claim 42, wherein said legs include telescoping portions.

45. The system of claim 42, wherein said stand has three legs, two of said legs including hooks for anchoring said screen.

46. The system of claim 30, including four said static electricity shields.

47. The system of claim 30, wherein said screen is transparent.

48. The system of claim 30, wherein the electrostatic discharge sensitive components are positioned upon a structure covered with a sheet of said static dissipative material.

49. The system of claim 48, wherein said sheet is grounded.

50. The system of claim 49, wherein said screen is connected to said sheet.

51. A method of shielding electrostatic discharge sensitive components from static electricity, comprising the steps of:
   placing electrostatic discharge sensitive components in a first area separated from a second area having static electricity generators;
   partitioning said first area from said second area with at least one portable retractable static electricity shield, each said shield including:
      a screen containing a static electricity dissipative material;
      a housing, said screen being extendable from and retractable into said housing; and
      a mounting structure adapted to mount said screen in a vertical direction;

extending said at least one screen in said vertical direction; and grounding said at least one extended screen.

52. The method of claim 51, wherein each said shield comprises at least one fastening structure for anchoring said screen.

53. The method of claim 51, wherein each said shield comprises a structure for extending and retracting said screen.

54. The method of claim 53, wherein said structure for extending and retracting includes a roller connected to a motor for driving said roller in opposite directions to extend and retract said screen, said screen being wound around said roller.

55. The method of claim 53, wherein said structure for extending and retracting includes a conductive roller which is driven by said motor.

56. The method of claim 51, wherein said static dissipative material has a resistance factor of no greater than $10^4$ ohms.

57. The method of claim 51, wherein said mounting structure comprises a stand including a spar having a bracket with a hook and a plurality of legs, said screen being anchored to said stand with said fastening structure.

58. The method of claim 52, wherein said fastening structure comprises a pivoting mechanism for enabling said shield to be pivoted into vertical alignment with said spar.

59. The method of claim 57, wherein said legs include telescoping portions.

60. The method of claim 57, wherein said stand has three legs, two of said legs including hooks for anchoring said screen.

* * * * *

UNITED STATES PATENT AND TRADEMARK OFFICE
CERTIFICATE OF CORRECTION

PATENT NO. : 6,331,927 B1  
DATED : December 18, 2001  
INVENTOR(S) : Overgaard

It is certified that error appears in the above-identified patent and that said Letters Patent is hereby corrected as shown below:

Column 1,
Line 42, "die shield" should be -- the shield --;

Column 5,
Line 29, "conductive" should be -- conductor --;
Line 38, "electrical outlet" should be -- overhead grid --;

Signed and Sealed this

Fifteenth Day of October, 2002

*Attest:*

*Attesting Officer*

JAMES E. ROGAN  
*Director of the United States Patent and Trademark Office*